United States Patent [19]

Croft

[11] Patent Number: 4,686,383

[45] Date of Patent: Aug. 11, 1987

[54] ELECTRONIC SWITCH WITH AUTOMATIC PROTECTIVE TURN-OFF FOLLOWED BY AUTOMATIC RESET

[75] Inventor: David C. Croft, Suffolk, United Kingdom

[73] Assignee: British Telecommunications Public Limited Company, United Kingdom

[21] Appl. No.: 639,328

[22] Filed: Aug. 10, 1984

[30] Foreign Application Priority Data

Aug. 10, 1983 [GB] United Kingdom ................ 8321549

[51] Int. Cl.$^4$ ...................... H02H 3/20; H03K 17/08; H03K 17/687

[52] U.S. Cl. ................................ 307/200 B; 307/571; 307/584; 361/98; 361/91; 361/56; 361/75

[58] Field of Search ................ 307/571, 575, 582–584, 307/450, 270, 240–242, 264, 594, 592, 200 B; 361/54, 56, 91, 111, 55, 59, 71, 75, 93, 94, 98

[56] References Cited

U.S. PATENT DOCUMENTS

| | | | |
|---|---|---|---|
| 3,970,869 | 7/1976 | Coats, Jr. | 307/570 |
| 4,090,227 | 5/1978 | Schweitzer | 361/59 X |
| 4,363,068 | 12/1982 | Burns | 361/91 |
| 4,424,544 | 1/1984 | Chang et al. | 361/91 X |
| 4,429,339 | 1/1984 | Jaeschke et al. | 361/91 X |
| 4,430,684 | 2/1984 | Lefebvre et al. | 361/59 X |
| 4,438,356 | 3/1984 | Fleischer | 307/571 |
| 4,445,055 | 4/1984 | Bete | 307/571 |
| 4,481,553 | 11/1984 | Owen et al. | 361/98 X |
| 4,491,750 | 1/1985 | Janutka | 307/570 X |
| 4,500,801 | 2/1985 | Janutka | 307/570 |
| 4,513,341 | 4/1985 | Kollanyi | 361/59 X |
| 4,543,494 | 9/1985 | Wakimoto | 307/200 B |
| 4,581,540 | 4/1986 | Guajardo | 361/93 X |
| 4,589,049 | 5/1986 | Krumrein | 361/91 X |
| 4,595,966 | 6/1986 | Huber et al. | 361/98 X |

FOREIGN PATENT DOCUMENTS

| | | |
|---|---|---|
| 3034927 | 3/1982 | Fed. Rep. of Germany . |
| 3202319 | 7/1983 | Fed. Rep. of Germany . |
| 2351545 | 9/1977 | France . |
| 164323 | 9/1983 | Japan ................... 307/584 |
| 178632 | 10/1983 | Japan ................... 307/571 |

OTHER PUBLICATIONS

IEEE International Solid-State Circuits Conference, Digest of Technical Papers, Feb. 1981, W. H. A. Mattheus: "400V switches for subscriber line interface", pp. 238–239.

Primary Examiner—Stanley D. Miller
Assistant Examiner—David R. Bertelson
Attorney, Agent, or Firm—Nixon & Vanderhye

[57] ABSTRACT

A switch transistor (V1) has a controlled pathconnected in a circuit (P-Q) to be switched, and Control signals are supplied (ID) to its control electrode to switch it on. If, in the ON state the potential difference across the switch exceeds a threshold value, trip means (T1) are actuated to turn the switch transistor off. To prevent premature tripping, delay means R2, C3 disable the trip means (by holding off T3) for a short period following switch on, but is arranged so as not to delay the trip action once that period has expired.

8 Claims, 3 Drawing Figures

ELECTRONIC SWITCH WITH AUTOMATIC PROTECTIVE TURN-OFF FOLLOWED BY AUTOMATIC RESET

The invention relates to electronic switches. Though of use in a variety of applications, it is of particular interest for the subscriber line interfaces of digital telephone exchanges where electromechanical relays are still widely used owing to the stringent requirements at this point in terms of isolation and voltage, current and surge capacity.

Electronic switches for this purpose have been proposed in Mattheus, W. H. A. "400 V Switches for Subscriber Line Interface", IEEE International Solid-State Circuits Conference, ISSCC Digest of Technical Papers, February 1981, pp 238–239. Such a switch is illustrated in FIG. 1, where a control signal at input terminals I is supplied via an isolation and drive circuit ID to the gates of a pair of vertical DMOS transistors V1, V2 connected in reverse series across output or "switch contact" terminals P, Q. A specification of ±400 V blocking voltage, ±100 mA d.c. capability with a 10Ω ON resistance is suggested, with a surge current capability of over 1A.

A problem with this type of switch is that of excessive surge currents when a substantial potential occurs across the switch in the 'on' condition. In the subscriber line interface application, current surges, due for example to the action of lightning or inadvertent mains contacts, represent a real hazard to the switch. This can be especially marked where switches are placed between an incoming line with voltage surge limiting at, for example, 250 V and perhaps a 50 V voltage surge limiter for protection of subsequent solid state switching circuits; the difference of 200 volts, appearing across the switch, can cause an instantaneous power dissipation sufficient to destroy the switching transistors.

According to the present invention there is provided a switch comprising a switch transistor having a controlled path for connection in a circuit to be switched, means for supplying control signals to a control electrode thereof to render the controlled path conductive, and trip means actuable by the potential difference across the controlled path exceeding a threshold value to render the transistor non-conducting, the trip means being arranged in operation to receive the said control signals via delay means and the said potential difference without substantial delay, so as to permit operation of the trip means only after the expiration of a predetermined delay period following application of the said control signals to the control electrode of the switch transistor.

Some embodiments of the present invention will now be described, by way of example, with reference to the accompanying drawings, in which.

Figure 1:
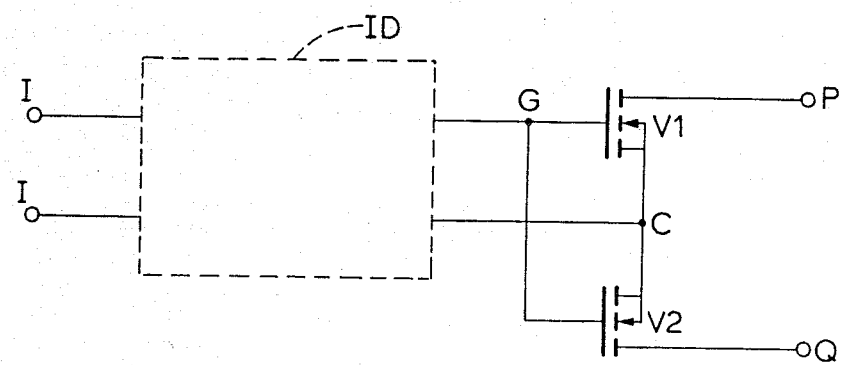
FIG. 1 is a depiction of a prior art switch.
Figure 2:
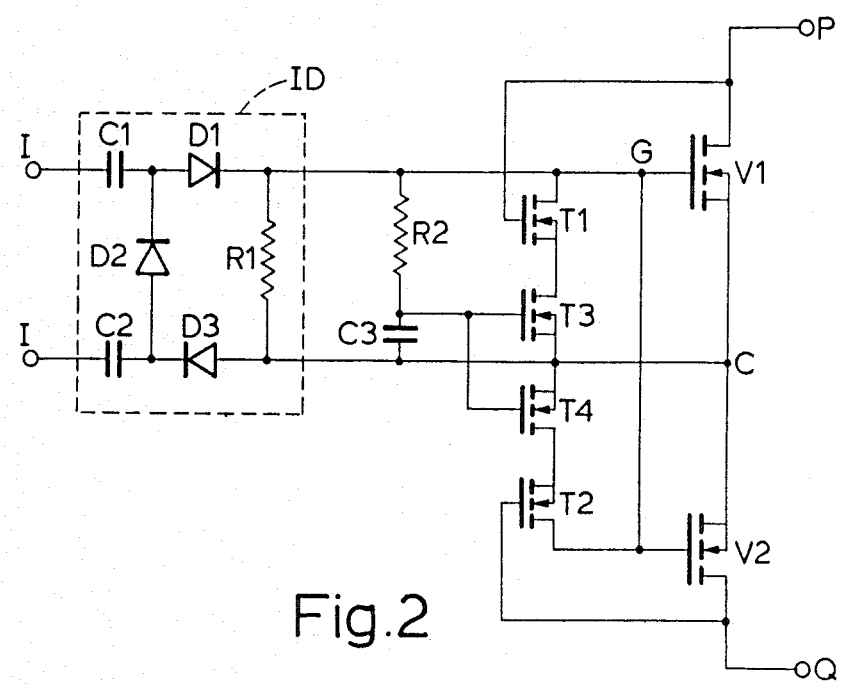
FIGS. 2 and 3 are circuit diagrams of alternative embodiments of the invention.

As shown in FIG. 2, MOS power transistors V1, V2 are connected, as before, in series across switch terminals P, Q. The gates and sources of the transistors are connected respectively to points G and C across which the drive signals from the isolation and drive circuit ID are connected. When turned on by a positive potential applied at G, the transistor V1 will pass conventional current from P to Q, transistor V2 passing current by virtue of the inherent diode action of the VMOS transistor in the reverse direction.

Similar remarks apply to current flowing from Q to P.

Two field-effect transistors T1, T2 have their drains connected to G, sources to C via n-channel FET's T3 and T4 respectively, and their gates to P and Q respectively. Assuming for the present that T3 and T4 are in the 'on' state, in the event of a current surge through the switch, the voltage PC or QC rises: when its threshold voltage is exceeded, transistor T1 or T2 turns on, reducing the voltage GC to zero, and the switch turns off.

The further transistors T3, T4, in series with transistors T1, T2, have their gate electrodes supplied from the control output of the drive circuit ID via an R-C circuit R2, C3. The R2/C3 element serves to delay the turn-on of transistors T3 and T4 on initial switch-on, ensuring that V1 and V2 are fully ON before the trip function is enabled. When the switch is ON (in the steady state), transistors T3 and T4 are also ON. In the event of a surge rendering transistor T1 (for example) conductive, the switch will turn off.

It will be appreciated, of course, that the gate-channel insulation of the transistors T1, T2 must be sufficient to withstand the likely potentials appearing between P and Q.

The form of the isolation and drive circuit ID is not material to the present invention, and could take the form described in the above-mentioned paper. As shown, however, it comprises isolating capacitors C1, C2 (typically 15 pF), diodes D1, D2, D3 and resistor R1 to convert push-pull square waves at the input I to a dc control voltage; smoothing being effected by the inherent gate capacitance of the transistors V1, V2.

The circuit shown is able to reset automatically when the off-state line voltage exceeds the threshold voltage, the switch is initially held off following the surge. Transistors T1 and T3 being turned on, however, permits the capacitor C3 to discharge via R2, turning transistor T3 off and thereby allowing transistor V1 to turn on again after a period—which might typically be 2 ms—determined by the time constant of C3/R2. If the surge persists beyond this period, the switch turns back on in a current-limit mode, returning to the fully-on state only when line conditions are normal. In the current limit mode, the gate-source voltages of T3 and V1 are the same and therefore the constant current passed by V1 will depend on the relative gate threshold voltages of these two transistors.

In FIG. 2, the substrates of transistors T1 and T2 can either be connected as shown, or connected with those of the other transistors to point C.

Figure 3:
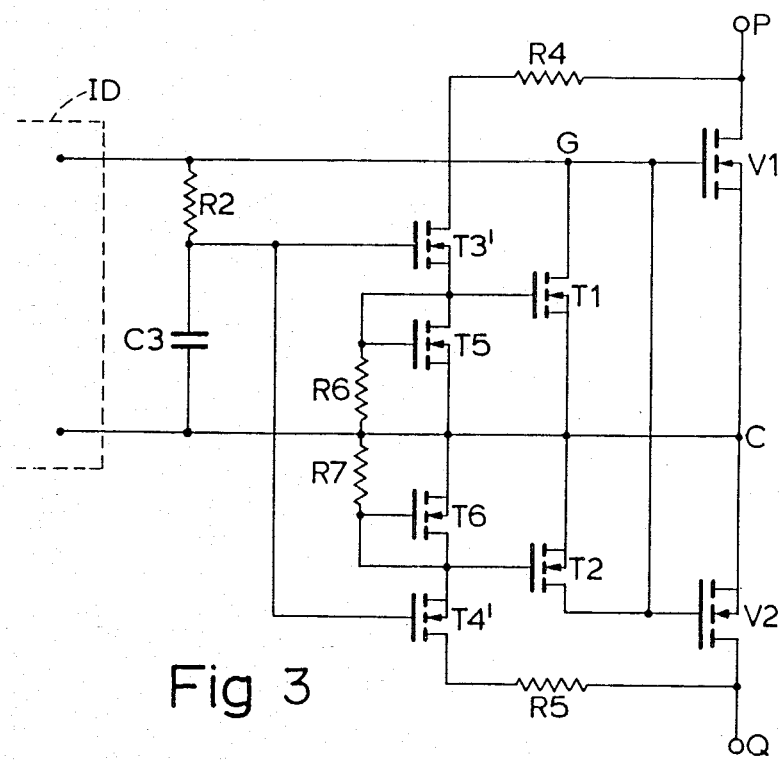

In the arrangements described above, the gates of transistors T1, T2 are subject to the maximum voltages appearing on the line which for some applications will require fabrication of transistors with improved gate oxide isolation characteristics and/or unduly limit the maximum surge voltages that can be tolerated. The modified arrangement of FIG. 3 is aimed at alleviating this problem. Instead of connecting the line terminal P directly to the gate of T1, a voltage-limiting arrangement is added, employing a series resistor R4 and a shunt arrangement consisting of a field-effect transistor T5 connected with pull-down resistor R6 in a constant voltage arrangement. A low voltage zener diode could be used, but the arrangement shown is simpler to implement in an integrated circuit.

The control transistor T3 in the source circuit of T1 is replaced by a transistor T3' in series with resistor R4 so that the voltage-limiting arrangement draws no current when the switch is turned off. This also has the effect of facilitating the attainment of a higher current in the current limiting mode since the voltage applied to the gate of V1 in this mode is now the sum of the threshold voltages of T3 and T1, rather than merely that of T3 as is the case in FIG. 3. An identical control arrangement, with transistors T4', T6 and resistors R5, R7, is provided for T2.

A prototype circuit according to FIG. 3 has been constructed having the following component values.

| | |
|---|---|
| V1, V2 | type IVN6100TNS |
| R2 | 10 MΩ |
| C1 | 150 pF |
| R4, R5 | 10 kΩ |
| R6, R7 | 330 kΩ |
| T1–T6 | type SD211 | and had an 'ON' resistance of 19Ω with a trip current of 110 mA and a constant current of 16 mA in current limiting mode.

In the circuits described, the transistors are all n-channel enhancement types: obviously p-channel types could be employed, with appropriate reversal of the polarity of the drive signals from the isolation and drive circuit ID.

Although realizable using discrete components, the circuits described readily lend themselves to fabrication as integrated circuits.

I claim:

1. A switch comprising:
   a switch transistor having a control electrode and also having a controlled path for connection in a circuit to be switched;
   first means connected to said switch transistor for supplying control signals to said control electrode to render the controlled path conductive;
   trip means including a second transistor connected to said first means and in a bypass path from the control electrode of said switch transistor and activated by a potential difference across said controlled path exceeding a threshold value to close said bypass path and render said switch transistor non-conducting, the trip means being connected to receive said control signals via delay means and said potential difference without substantial delay, so as to permit operation of the trip means only after the expiration of a predetermined delay period following application of said control signals to the control electrode of the switch transistor; and
   said trip means also including control means comprising a third transistor with its control electrode supplied via an RC delay element from the control electrode of said switch transistor and coupled to said switch transistor to open said bypass path when rendered non-conductive thus rendering said switch transistor at least partially conductive at the expiration of a predetermined delay period following actuation of the trip means.

2. A switch according to claim 1 in which the source-drain path of the third transistor is connected to said bypass path.

3. A switch according to claim 1 in which the gate of the second transistor is connected to the drain of the switch transistor via the source-drain path of the third transistor.

4. A switch according to claim 3 wherein the control means includes a current-limiting resistance connected between the drain of the switch transistor and the source-drain path of the third transistor, and also including a fourth transistor, connected in a voltage-limiting configuration, to the gate of the second transistor.

5. A switch as in claim 1 in which said third transistor comprises a field effect transistor.

6. A switch as in claim 1 wherein said switch transistor and said second and third transistors are field effect transistors.

7. A switch as in claim 1 wherein said delay means comprises said RC delay element.

8. A switch comprising:
   a switch transistor having a control electrode and also having a controlled path for connection in a circuit to be switched,
   first means connected to said switch transistor for supplying control signals to a control electrode thereof to render the controlled path conductive;
   trip means connected to said first means and actuated by a potential difference across the controlled path exceeding a threshold value to render the transistor non-conducting, the trip means being connected to receive said control signals via delay means and said potential difference without substantial delay, so as to permit operation of the trip means only after the expiration of a predetermined delay period following application of said control signals to the control electrode of the switch transistor; and
   said trip means including control means coupled to said switch transistor for rendering the switch transistor at least partially conductive at the expiration of a predetermined delay period following actuation of the trip means;
   said switch including a pair of said switch transistors connected to one another in series with their respective source-drain circuits being oppositely directed and wherein each of said switch transistors is connected with a respective one of said trip means.

* * * * *